US007792311B1

(12) United States Patent
Holmgren et al.

(10) Patent No.: US 7,792,311 B1
(45) Date of Patent: Sep. 7, 2010

(54) METHOD AND APPARATUS FOR AUTOMATICALLY ENABLING SUBWOOFER CHANNEL AUDIO BASED ON DETECTION OF SUBWOOFER DEVICE

(75) Inventors: Steve F. Holmgren, Santa Barbara, CA (US); Jonathan P. Lang, Santa Barbara, CA (US); L. Dexter Bates, Somerville, MA (US); John L. MacFarlane, Montecito, CA (US)

(73) Assignee: Sonos, Inc.,, Santa Barbara, CA (US)

( * ) Notice: Subject to any disclaimer, the term of this patent is extended or adjusted under 35 U.S.C. 154(b) by 1400 days.

(21) Appl. No.: 10/845,925

(22) Filed: May 15, 2004

(51) Int. Cl.
*H03G 3/00* (2006.01)
*H04R 5/00* (2006.01)

(52) U.S. Cl. .............................. 381/61; 381/22; 381/17

(58) Field of Classification Search .................. 381/27, 381/63, 61, 387, 59, 56, 58, 307, 119, 85, 381/300, 303, 17–19, 21, 23, 77, 22
See application file for complete search history.

(56) References Cited

U.S. PATENT DOCUMENTS

| | | | | |
|---|---|---|---|---|
| 6,916,980 | B2 * | 7/2005 | Ishida et al. | 84/743 |
| 6,931,134 | B1 * | 8/2005 | Waller et al. | 381/27 |
| 2002/0078161 | A1 * | 6/2002 | Cheng | 709/208 |
| 2003/0002689 | A1 * | 1/2003 | Folio | 381/77 |
| 2003/0161479 | A1 * | 8/2003 | Yang et al. | 381/22 |
| 2005/0147261 | A1 * | 7/2005 | Yeh | 381/92 |

* cited by examiner

*Primary Examiner*—Vivian Chin
*Assistant Examiner*—George Monikang
(74) *Attorney, Agent, or Firm*—Joe Zheng

(57) ABSTRACT

Techniques for processing input signals in accordance with an output configuration are disclosed. According to one aspect of the techniques, a module implemented in a sound reproducing device is configured to determine whether a sound in the input audio source can be reproduced properly through speakers of an output configuration of the device by examining the sound effects in the input audio sound and the output channel in the output configuration, producing synthetically a sound effect if the number of sound channels is greater than the number of sound effects, or reducing synthetically a sound effect if the number of sound channels is less than the number of sound effects.

35 Claims, 5 Drawing Sheets

200

300

METHOD AND APPARATUS FOR AUTOMATICALLY ENABLING SUBWOOFER CHANNEL AUDIO BASED ON DETECTION OF SUBWOOFER DEVICE

BACKGROUND OF THE INVENTION

1. Field of the Invention

The invention is generally related to the area of audio technologies. In particular, the invention is related to method and apparatus for automatically enabling a subwoofer channel output based on automatic detection of one or more subwoofer devices.

2. The Background of Related Art

A conventional stereo audio player usually contains an amplifier to power a set of speakers. A typical amplifier is configured for a predetermined set of channels, for example, three channels (i.e., left, right and subwoofer). The stereo audio player receives audio sources as an input, converts the input to analog audio signals that are then amplified in one or more amplifiers to drive the speakers so as to reproduce audio sounds. In general, primary configurations for an audio player may include a 2-channel, 3-channel or 6-channel connection.

1) 2-channel: the stereo audio player is connected to two speakers: left and right speakers to form a stereo sound;

2) 3-channel (or 2.1 sound effects): the stereo audio player is connected to three speakers: left and right speakers and a subwoofer to form a stereo sound; and 3) 6-channel (or 5.1 sound effects): the stereo audio player is connected to five speakers: front left, front right, center, rear left and rear right speakers and a subwoofer to form a surrounding sound.

Subwoofer is a loudspeaker that is capable of reproducing audio sound in bass or low frequencies. The audio source input to an audio player may be in different sound effect configurations, for example, 2-channel or 3-channel. If the audio source input matches the output speaker configuration, the analog output audio signal will be played properly at each corresponding speaker. In the case where the input and output configuration mismatch, the audio player may not reproduce the audio properly if the audio player is not configured to process the mismatch. For example, a 2-channel input is provided to a stereo audio player that is connected to left and right speakers and a subwoofer. A mismatch between the input and the output configuration would manifest as no sound comes out of the subwoofer. Likewise, a 3-channel input is provided to an audio player that is connected to only left and right speakers, the mismatch between the input and the output configuration would cause lacking of bass or low frequencies sound when the stereo audio player assumes a subwoofer exists, but in fact it is not.

On the input side, detecting the source format or configuration is relatively easy, especially when the source is in digital format (i.e., from the audio data encoding scheme). On the output side, the industry standard passive speaker interconnects do not support auto-discovery or speaker device interrogation. To solve this problem, today's audio players often require intervention from a user to set a given configuration or predetermined output configuration. For example, there may be a physical switch that enables or disables a subwoofer or a set of predetermined output patterns provided by an audio player for a user to connect the audio player to corresponding speakers or a subwoofer if there is one. While the current solution may be satisfactory, it is, however, inconvenient and confusing for many users who are not skilled in the audio field.

There is, therefore, a need for solutions in stereo audio players to automatically convert an input audio source properly to match physical audio output speakers based upon detection of the physical output speakers, especially the presence of a subwoofer.

SUMMARY OF THE INVENTION

This section is for the purpose of summarizing some aspects of the present invention and to briefly introduce some preferred embodiments. Simplifications or omissions in this section as well as in the abstract or the title of this description may be made to avoid obscuring the purpose of this section, the abstract and the title. Such simplifications or omissions are not intended to limit the scope of the present invention.

In general, the present invention pertains to automatically matching input audio effects with output configurations for sound reproduction with high fidelity. The audio effects include, but are not limited to, respective channels and frequency specifications in each channel. In particular, the present invention enables automatically one or more auxiliary audio channels based on detection of one or more speakers. According to one aspect of the present invention, a subwoofer channel is synthetically produced in a device when the device is connected to a subwoofer while the audio sources received are not configured for the subwoofer. The format of the audio sources may be for a 2-channel sound effect (including a left sound effect and a right sound effect) while the output configuration is for 3-channel output (i.e., a three-speaker configuration), in which case a channel signal is synthetically produced. Alternatively, the format of the audio sources may be for a 3-channel sound effect (including a left sound effect, a right effect and a subwoofer effect) while the output configuration is for 2-channel output, in which case, the subwoofer channel is redistributed to the left and right channels in the output configuration.

According to another aspect of the present invention, a configurable module is implemented in a device that produces a synthetic channel signal or processes input signals in accordance with an output configuration of the device. The module operates in response to a signal indicating what an output configuration is for the device. Depending on an implementation of the device, the signal may be generated or produced in accordance with connectors in the device to which actual speakers are connected.

According to yet another aspect of the present invention, a zone player is configured to preprocess an audio source that is to be played in another zone player, which may happen in a situation in which a user moves from one location to another with a different zone player. An audio source being played in a first zone player may have already been downloaded or been streaming therein. When the same music is to be played in a second zone player, the present invention makes it possible to have the first zone player to process or continue to process the audio source in accordance with the detection of the output configuration of the second zone player.

The present invention may be implemented in many forms including software, hardware or a combination of both. According to one embodiment, the present invention is an apparatus for processing input signals in accordance with an output configuration, the apparatus comprises a first module to determine whether a sound in an input audio source can be reproduced properly through an output configuration of speakers by comparing a number of sound effects configured in the input audio source to a number of sound channels in the output configuration, a second module, in responding to the first module, configured to synthetically produce a sound effect if the number of sound channels is greater than the number of sound effects, and to synthetically reduce a sound effect if the number of sound channels is less than the number of sound effects.

According to one embodiment, the present invention is a method for processing input signals in accordance with an output configuration, the method comprises comparing a number of sound effects configured in the input audio source to a number of sound channels in the output configuration, determining whether a sound in the input audio source can be reproduced properly through speakers of the output configuration, producing synthetically a sound effect if the number of sound channels is greater than the number of sound effects, or reducing synthetically a sound effect if the number of sound channels is less than the number of sound effects.

One of the objects, features, advantages of the present invention is to determine whether a sound in the input audio source can be reproduced properly through speakers of the output configuration, producing synthetically a sound effect if the number of sound channels is greater than the number of sound effects, or reducing synthetically a sound effect if the number of sound channels is less than the number of sound effects.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENT

The present invention pertains to techniques for processing input signals to match an output configuration of a sound reproducing device. According to one aspect of the present invention, a module implemented in a sound reproducing device is configured to determine whether a sound in the input audio source can be reproduced properly through speakers of the output configuration, produce synthetically a sound effect if the number of sound channels is greater than the number of sound effects, or reduce synthetically a sound effect if the number of sound channels is less than the number of sound effects.

The detailed description of the present invention is presented largely in terms of procedures, steps, logic blocks, processing, or other symbolic representations that directly or indirectly resemble the operations of devices or systems that can be used on networks. These descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Figure 1:
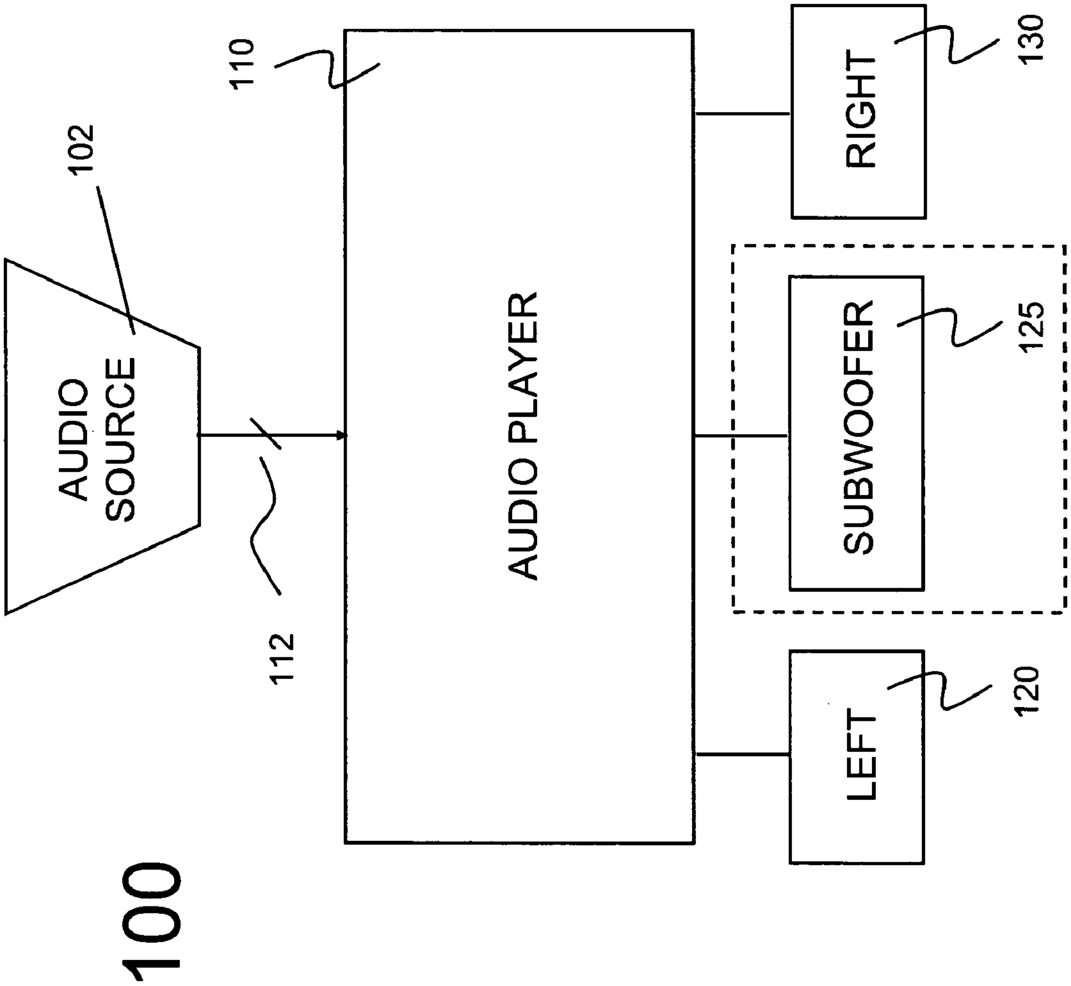
FIG. 1 shows an exemplary configuration in which the present invention may be practiced, the configuration may represent, but not be limited to, a part of a sound reproducing system, a television set or a home theater system.

Referring now to the drawings, in which like numerals refer to like parts throughout the several views. FIG. 1 shows an exemplary configuration 100 in which the present invention may be practiced. The configuration may represent, but not be limited to, a part of a sound reproducing device or system, a television set or a home theater system.

To facilitate the understanding of the present invention, it is assumed that the configuration 100 represents an audio player 110 configured to receive digital files and reproduce sounds from an audio source 102. In one embodiment, the player 110 is coupled to a network that can be wireless or wired, and part of a local area network or a wide area network. The digital files may be locally generated (e.g., from analog signals), from a source (e.g., DVD, or CD), downloaded or streamed from another device that is also coupled to the network.

As used herein, unless explicitly stated otherwise, an audio source or audio sources that are received or provided to the player 110 are in digital format and can be transported over a data network. An audio output signal or audio output signals are in analog format to drive one or more speakers connected to the player 110. As shown in FIG. 1, the player 110 is connected to three speakers, a left speaker 120, a right speaker 130 and a subwoofer 125. In operation, the player 110 receives audio sources 102 as an input, processes the input, and converts the input to analog signals that are then amplified to drive the speakers 120, 125 and 130.

The audio source device 102 and the stereo audio player 110 communicate via a data network 112. The speakers 120 and 130, and subwoofer 125 are connected to the stereo audio player 110 with one RCA cable for each speaker/subwoofer. The setup with two, left and right, speakers is referred as 2-channel output configuration, while the setup with left and right speakers as well as a subwoofer is referred as 3-channel output configuration. A 5-channel output configuration consists of 5 speakers: front left, front right, rear left, rear right, and subwoofer. Subwoofer 125 is used for playback of low frequencies sound or bass.

Similar to the output configuration, there are different formats for the audio source 102. For example, a 2-channel audio source contains left and right channel inputs (resulting in left and right sound effects) while a 3-channel audio source not only contains left and right channel inputs, it also contains a subwoofer channel input (resulting in a third sound effect). In one embodiment, the player 110 processes the audio source to match the input format with the output configuration. As a result, the sound from the audio source can be reproduced properly at each of the corresponding speakers. In another embodiment, when the player 110 detects mismatching between the input format and the output configuration, a low frequencies sound must be either combined or split to synthetically produce a subwoofer channel audio before the sound is reproduced at each of the corresponding speakers.

Many devices on the network 112 are configured to download, store audio sources or receive streaming audio sources. For example, the device 110 can download audio sources from the Internet and store the downloaded sources locally for sharing with other devices on the Internet or the network 112. The device 110 can also be configured to receive streaming audios. In accordance with the present invention, the audio source may be shared among the devices on the network 112. Although the player 110 may be configured to be able to download or store audio resources, the following description is based on the assumption that the player 110 needs to retrieve selected audio sources from other devices (e.g., the audio source device 102) for playback.

Figure 2A:
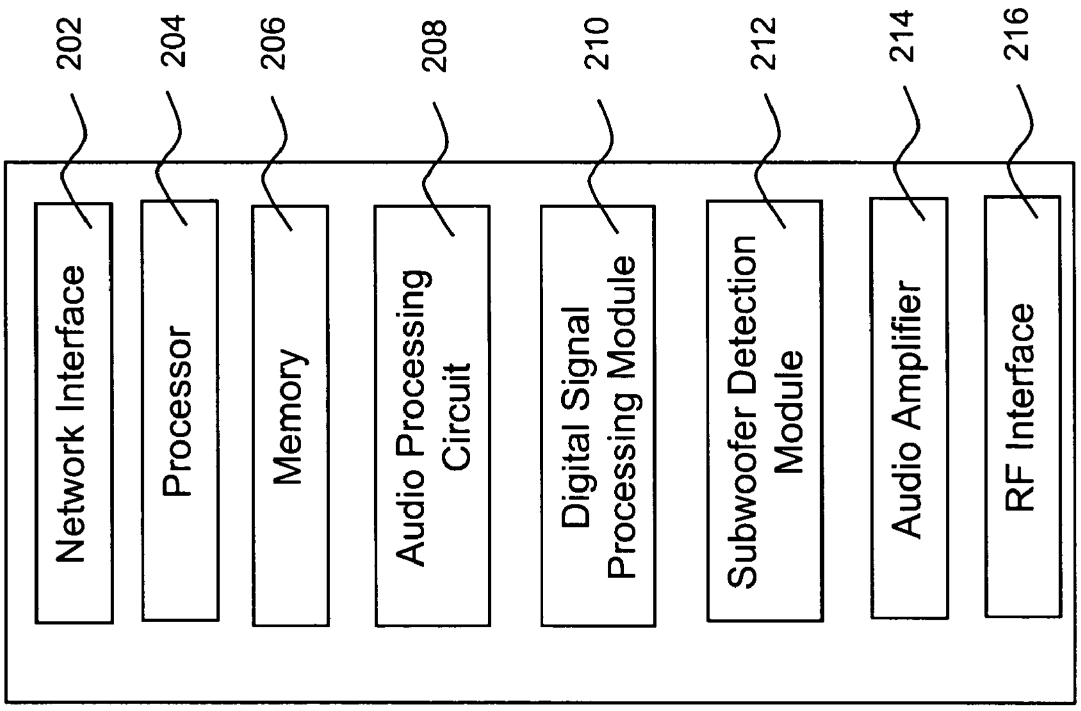
FIG. 2A shows an exemplary functional block diagram of a player in accordance with the present invention.

FIG. 2A shows an exemplary functional block diagram of a player 200 in accordance with the present invention. The player 200 includes a network interface 202, a processor 204, a memory 206, an audio processing circuit 208, a digital signal processing module 210, a subwoofer detection module 212, an audio amplifier 214 and a RF interface 216. The network interface 202 facilitates the player 200 to send and receive a data flow across a data network (i.e., the data network 112 of FIG. 1) and typically executes a special set of rules (i.e., a protocol) in the data flow. One of the common protocols is TCP/IP (Transmission Control Protocol/Internet Protocol) commonly used in the Internet. In general, a network interface manages the assembling of an audio source or file into smaller packets that are transmitted over the data network or reassembles received packets into the original source or file. In addition, the network interface 202 handles the address part of each packet so that it gets to the right destination or intercepts packets destined for the player 200.

In particular, the network interface 202 allows the player 200 to receive a selected song or a selected piece of music from an audio source device 102 on the network 112. The processor 204 is configured to control the operation of other parts in the player 200. The memory 206 may be loaded with one or more software modules that can be executed by the processor 204 to achieve desired tasks. According to one aspect of the present invention, a software module implementing one embodiment of the present invention is executed, the digital signal processing module 210 operates in accordance with the software module to synthetically produce a subwoofer channel audio based upon the information obtained via the subwoofer detection module 212 (e.g., presence/absence of a subwoofer and a configuration of input audio source).

The audio processing circuit 208 resembles most of the circuitry in an audio playback device and includes one or more digital-to-analog converters (DAC), an audio preprocessing part, an audio enhancement part or a digital signal processor and others. In operation, when an audio source is retrieved via the network interface 202, the audio source is processed in the audio processing circuit 208 to produce analog audio signals. The processed analog audio signals are then provided to the audio amplifier 214 for playback on one or more speakers and subwoofers.

The digital signal processing module 210 may be implemented as a software module or a hardware module (e.g., application specific integrated circuit or field programmable gate array or programmable logic device). Based upon the determination of matching or mismatching of the input and output configuration, the digital signal processing module 210 may combine or split the input audio source to create a proper audio output for the output speaker configuration. Depending on an exact implementation, the digital signal processing module 210 may be implemented within the audio processing circuit 208 or as a combination of hardware and software. The subwoofer detection module 212 detects the presence or the absence of a subwoofer either mechanically or electrically. The audio amplifier 214 is typically an analog circuit that powers the provided analog audio signals to drive one or more speakers and one or more subwoofers.

Figure 2B:
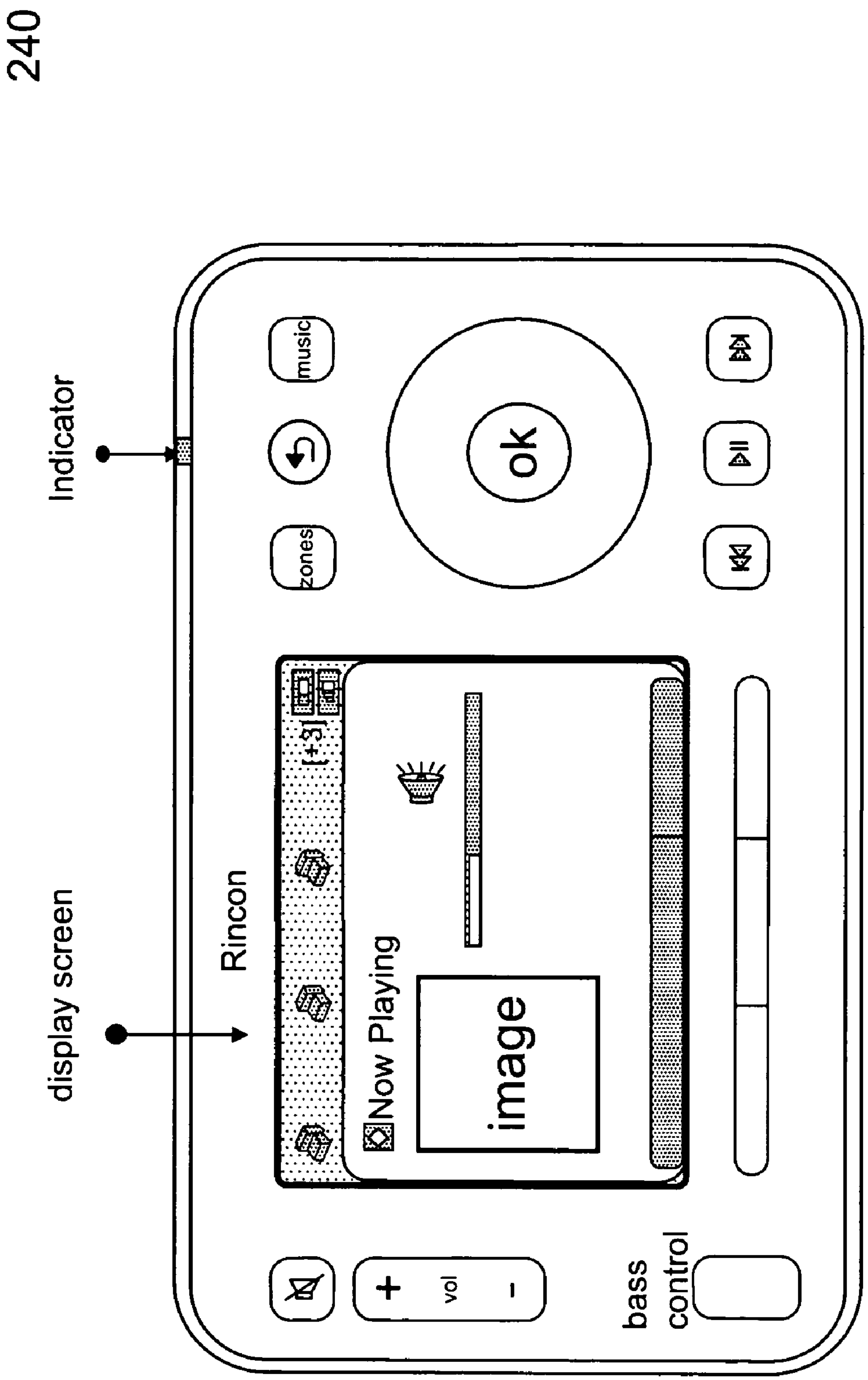
FIG. 2B shows an example of a portable controller that may be used to remotely control the player of FIG. 2A.

The RF interface 216 provides wireless means for the player 200 to communicate with a controller, preferably a portable. An example of the controller 240 is shown in FIG. 2B. According to one embodiment, the wireless means is based on an industry standard (e.g., infrared, radio, wireless standard 802.11b or 802.11g). The controller 240 may be used to facilitate a selection of a plurality of audio sources available on the network, controlling operation of the player 200 through the RF interface 214. When a particular audio source is being played in the player 200, a picture, if there is any, associated with the audio source may be transmitted from the player 200 to the controller 240 for display. In one embodiment, the controller 240 is used to adjust a crossover freq, a subwoofer volume, or a bass boost when a subwoofer is detected.

Figure 3:
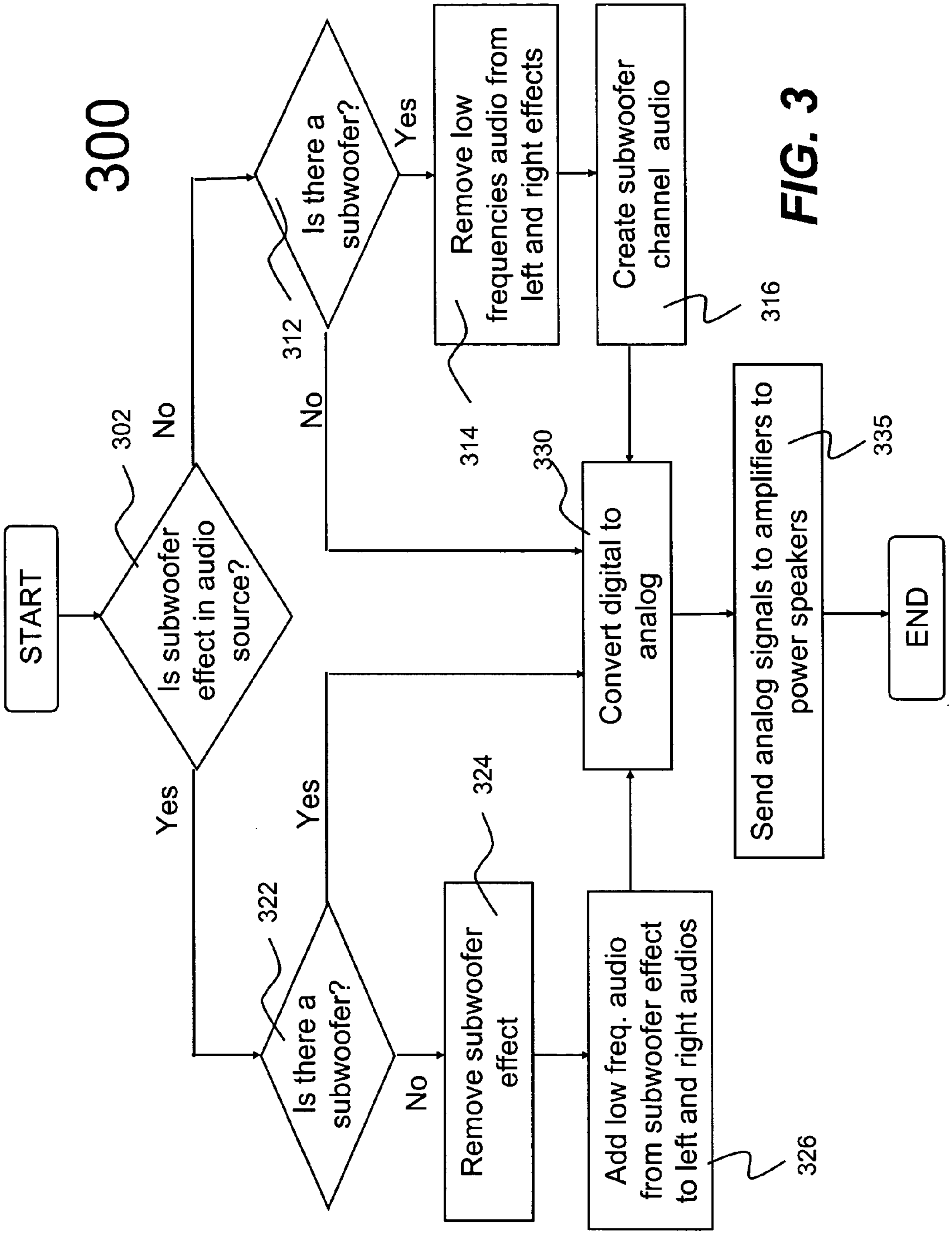
FIG. 3 shows a flowchart or process of a module implementing one embodiment of the present invention.

FIG. 3 shows a flowchart or process 300 of a module implementing one embodiment of the present invention. The process 300, which is preferably understood in conjunction with the previous figures, may be implemented in software, hardware, or a combination of both. According to one embodiment, the module is embedded in a player, for example, the device 200 of FIG. 2. The module may be loaded in the memory 206 to be executed by the processor 204 and operating in conjunction with the digital signal processing module 210 or in the subwoofer detection module 212. In one embodiment, the module is configured to detect automatically the presence or absence of a subwoofer, and to adjust the audio input by properly combining or splitting the low frequencies portion in a sound for proper reproduction of the sound in the connected speakers.

At 302, the process 300 determines if the format of audio sources includes a subwoofer channel effect. There are a number of ways to determine the format of audio sources. One of them is to examine the encoding part of the audio sources. Another is through a logic circuit. Then the process 300 splits to two different branches depending on whether there is a subwoofer channel effect in the audio sources.

In the case where the audio sources lack of the subwoofer channel effect, the process 300 goes on to determine the output speaker configuration, especially the presence or absence of a subwoofer at 312. In one embodiment, the determination at 312 is performed by the subwoofer detection module 212 as shown in FIG. 2A. If the subwoofer is absent in the output speaker configuration, then the input format of the audio sources match the output configuration. Thus, there is no need to alter the input audio sources. The process 300 moves directly to 330, in which the audio sources are converted to analog signals that are amplified to drive corresponding speakers at 335.

However, if a subwoofer is present in the output speaker configuration, the test at 312 is true. Thus the format of the audio sources does not match the output configuration, which means that the subwoofer exists but there is no subwoofer channel effect to be played back. As a result of this mismatch, the process 300 performs to produce a subwoofer channel audio synthetically. At 314, according to one embodiment, the portion of the sound below a cut-off frequency is removed from both the left and right input audio effects. The cut-off frequency is pre-determined or dynamically calculated depending on the subwoofer effect in the audio sources.

At 316, the subwoofer channel effect is synthetically created by combining the removed low frequencies sound from 314. In one embodiment, the process at 314 and 316 may be performed by the digital signal processing module 210 of FIG. 2A. In another embodiment, the subwoofer channel effect is created using a filtering process that removes audio frequencies below a predetermined value from the left and right effects, and combines the removed audio frequencies to create a subwoofer channel effect. For example, $L_{removed}$ and $R_{removed}$ are the removed portions of the left and the right effects in the input source, the subwoofer effect can be determined by $S_{new}=(L_{removed}+R_{removed})/2$. After the subwoofer channel audio effect is produced synthetically, the process 300 can then move to 330 to convert three digital signals to three analog signals that are amplified in one or more amplifiers at 335. As a result, a subwoofer that is connected to a player receives the proper subwoofer signal while the left and right speakers receive corresponding signals, the sound in the input sources is reproduced with high fidelity.

Referring back to the test at 302, in the case where the audio sources include a subwoofer channel effect, the process 300 determines the output speaker configuration, especially the presence or absence of a subwoofer at 322. If the subwoofer is present in the output speaker configuration, then the input format of the audio sources matches the output configuration. The process 300 moves on to 330 and 335 as there is no need to alter the audio sources. The audio channels can be played back at corresponding speakers properly.

In the case of the absence of a subwoofer, the input format and the output configuration are mismatched. In order to maintain the high fidelity audio sound reproduction, the process 300 needs to alter the input audio sources. In one embodiment, at 324, the process 300 may remove subwoofer audio effect. Then at 326, the process 300 adds low frequencies sound from the removed subwoofer audio source from 324 into the left and the right effects. After this synthetic alteration of the audio sources, the altered audio sources can be converted to analog signals at 330 and then amplified at 335 to drive one or more speakers.

In one embodiment, the revised left effect in the audio source is achieved in accordance with the following computations: $L_{new}=L_{orig}+S/2$ and $R_{new}=R_{orig}+S/2$, where S is the original subwoofer effect in the input sources, $L_{orig}$ and $R_{orig}$ are the original left and right effects in the input sources, and $L_{new}$ and $R_{new}$ are the newly altered left and right effects for the left and right channel, respectively.

It should be noted that FIG. 3 is presented in accordance with three sound effects or an output configuration of three speakers. Those skilled in the art can now appreciate that FIG. 3 can be readily extended to other forms or sound effects of audio inputs as well as different output configurations.

The detection of the presence or absence of a subwoofer can be done electronically or mechanically. According to one embodiment, a special type of connector (e.g., a tip-shunt connector) is used. A voltage pertaining to the connector can be read in the tip-shunt connector and the voltage is then compared to a threshold value. In general, depending on the type of a tip-shunt connector, the voltage changes when a jack or plug is inserted into or connected to the tip-shunt connector. It is assumed that the voltage goes higher when a jack or plug is connected to the tip-shunt connector and the voltage goes lower when nothing is inserted into the tip-shunt connector. Accordingly, when a voltage reading is higher than the threshold value, it indicates the presence of a subwoofer (i.e., the tip-shunt connector is connected to a subwoofer). When a voltage reading is lower than the threshold value, it indicates the absence of a subwoofer (i.e., the tip-shunt connector is not connected to anything). Consequently, a status signal or an UPnP message can be generated or distributed to control the operation of the player, wherein UPnP stands for Universal Plug and Play that is a set of computer network protocols promulgated by the UPnP Forum (www.upnp.org).

In one embodiment, the threshold is set at 2.5 Volts DC. The threshold value is derived from an exemplary subwoofer RCA cable with 22,000 ohm resistor relative to ground. The shunt of the tip-shunt connector has a 1,000,000 ohm resistor and pulls up to 5 Volts DC. As long as nothing is plugged in, the voltage on both tip and shunt is roughly $5\times(22{,}000/(22{,}000+1{,}000{,}000))$ or approximately 0.108 Volts DC. When the subwoofer RCA cable is plugged into the connector, the voltage of the shunt pulls up to 5 Volts DC.

In another embodiment, a subwoofer output jack is an ordinary RCA tip-shunt jack, identical in function to the ¼" phone jacks commonly seen on headphone outputs. With no cable attached, the RCA jack's tip shunt is connected to the tip. The subwoofer output line, which is by default connected to the tip, has a 22K resistor to ground. The shunt itself has a 1M ohm resistor pullup to +5 VDC. As long as nothing is plugged in, the voltage on both tip and shunt is roughly $5\times(22K/(22K+1M))$ or approximately 0.1 VDC. When the cable is plugged into the jack, the shunt separates from the tip. As a result, the 1M resistor then pulls the shunt up to 5 VDC. The shunt is connected to one of the analog ADC inputs of the M16C microcontroller, dividing down enough to match a 3.3V maximum input level, which is being monitored by, for example, the Subwoofer Detection Module 212 of FIG. 2A. The Digital Signal Processing Module 210 of FIG. 2A or the process 300 of FIG. 3 thus works accordingly to ensure that the signals for the output configuration matches the input effects.

Alternatively, the detection of the presence or absence of a subwoofer can be done mechanically and readily by using a type of connector. The presence of a subwoofer is indicated when, for example, a RCA cable is plugged into a tip-shunt connector. If there is no cable in the connector, it indicates an absence of the subwoofer. As a result of the physical change of the connector, a status signal or an UPnP message can be generated or distributed to control the operation of the player.

Figure 4:
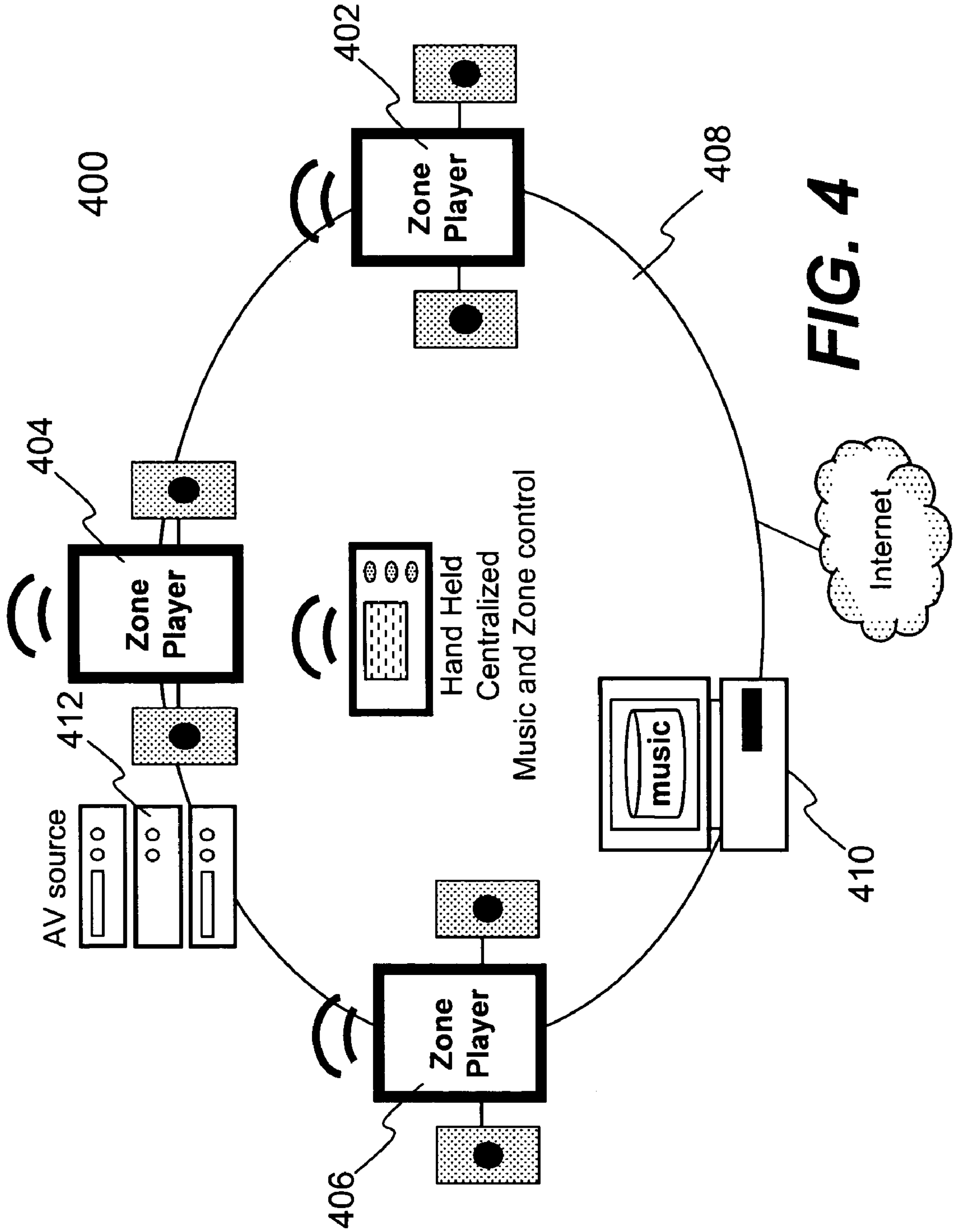
FIG. 4 shows an exemplary configuration in which the present invention may be practiced.

FIG. 4 shows an exemplary configuration 400 in which the present invention may be practiced. The configuration 400 may represent, but not be limited to, a part of a residential home, a business building or a complex. There are a number of audio devices or players of which three examples 402, 404 and 406 are shown. Each of the audio devices may be installed or provided in one particular area or zone and hence referred to as a zone player herein.

All of the zone players 402, 404 and 406 are coupled to a data network 408. In addition, a computing device 410 is shown to be coupled on the network 408. In reality, any other devices such as a home gateway device, a storage device, or an MP3 player may be coupled to the network 408 as well.

The network 408 may be a wired network, a wireless network or a combination of both. In one example, all devices including the zone players 402, 404 and 406 are coupled to the network 408 by wireless means based on an industry standard such as 811.02 or WiFi. In another example, all devices including the zone players 402, 404 and 406 are part of a local area network that communicate with a wide area network (e.g., the Internet).

Many devices on the network 408 are configured to download and store audio sources. For example, the computing device 410 can download audio sources from the Internet and store the downloaded sources locally for sharing with other devices on the Internet or the network 408. The computing device 410 can also be configured to receive streaming audios. Shown as a stereo system, the device 412 is configured to convert an analog source (e.g., from broadcasting) to a digital audio source or retrieve an audio source (e.g., from a compact disk). In accordance with the present invention, the audio source may be shared among the devices on the network 408. In addition, each of the zone players may be configured to be able to download or store audio resources.

According to one embodiment of the present invention, a zone player may preprocess an audio source that is to be played in another zone player, which may happen in a situation in which a user moves from one location to another with a different zone player. An audio source being played in a first zone player may have already be downloaded or been streaming therein. When the same music is to be played in a second zone player, the present invention makes it possible to have the first zone player to process or continue to process the audio source in accordance with the detection of the output configuration of the second zone player.

According to one embodiment, the second zone player, upon detecting the proper output configuration in view of the input sound effects, advertises itself to a hosting device holding the audio source by, for example, sending a message (e.g. UPnP message). If the hosting device (i.e., the first zone player) has the mechanism to process the audio source in accordance with the message, the audio source arrived in the second zone player will not be processed. The operation of the first zone player is similar to the process of FIG. 3 and will not be repeated to avoid obscuring aspects of the present invention.

It should be noted that the automatic detection mechanism as described above also applies to the detection of an input device. In general, a player includes a panel of input connectors suitable for connecting to a set of various input devices, such as a DVD player or a MP3 player. The detection of an input device may facilitate the control of the portable controller 240 of FIG. 2B. In the context of the present invention, the portable controller 240, configured to control a number of players in a location, is operated remotely in a sense that a user thereof may not see a player being controlled. By the automatic detection mechanism, the user can now see what is being connected to a player and switch from one input device to another input device. In conjunction with FIG. 4, the user is able to listen to a desired sound from a player coupled to another player providing or replaying the audio source.

The present invention can be implemented in many ways, each of which may yield one or more of the following benefits, advantages or features. First, a procedure to produce subwoofer channel audio synthetically if the audio input format and the speaker configuration do not match. Second, the software-based implementation of the present invention allows more sophisticated algorithm, to combine or split the audio source to create subwoofer audio channel. In reality, it is desirable to detect a subwoofer automatically and to reproduce the highest possible fidelity sound from the audio source without any intervention from the user. Other benefits, advantages or features can be appreciated by those skilled in the art given the detailed description herein.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claim. For example, the present invention may also be applied to other forms of inputs supplied to an audio player system that may have an entirely different output configuration. Although not specifically described, it is now clear to those skilled in the art that the present invention may also be used to detect other speakers other than a subwoofer. Accordingly, the scope of the present invention is defined by the appended claims rather than the forgoing description of embodiments.

We claim:

1. An apparatus for processing input signals in accordance with an output configuration, the apparatus comprising:

a first module to determine whether a sound signal in an input audio source is reproduced properly with respect to an output configuration of speakers by comparing a number of sound channels in the input audio source to a number of sound channels in the output configuration, wherein the input audio source represented in data packets is selected from a controller and received via a network interface from another device over a data network;

a second module, in responding to the first module, configured to synthetically produce a sound effect from the input audio source if the number of sound channels in the output configuration is greater than the number of sound channels in the input audio source, or to synthetically reduce a sound effect from the input audio source if the number of sound channels in the output configuration is less than the number of sound channels in the input audio source; and a network interface, coupled to the first module, reassembling the data packets received from the data network into the input audio source, wherein the apparatus is coupled to at least another device over the network, the network interface is capable of assembling an audio source into smaller packets to be transmitted over the data network to the another device, wherein the controller communicates with the apparatus via the network interface.

2. The apparatus of claim 1, wherein the sound channels in the input audio source include a left channel effect and a right channel effect, and the output configuration includes a left speaker, a right speaker and a subwoofer, and wherein the sound channel produced synthetically includes respective portions of the left channel effect or the right channel effect in the input audio and is reproduced through the subwoofer.

3. The apparatus of claim 2, wherein the respective portions of the left channel effect or the right channel effect in the input audio include frequencies below a predetermined frequency.

4. The apparatus of claim 2, wherein the left channel effect and the right channel effect originally in the input audio are respectively revised by removing the respective portions of the left channel effect and the right channel effect, and respectively reproduced in the left speaker and the right speaker.

5. The apparatus of claim 1, wherein the sound channels in the input audio source include a left channel effect, a right channel effect and a subwoofer effect, and the output configuration includes a left speaker and a right speaker, and wherein the sound effect reduced synthetically is the subwoofer effect.

6. The apparatus of claim 5, wherein the left channel effect and the right channel effect originally in the input audio are respectively revised to include at least some of the subwoofer effect.

7. The apparatus of claim 6, wherein the revised left channel effect and the right channel effect are respectively reproduced in the left speaker and the right speaker.

8. The apparatus of claim 1, wherein the input audio source is in digital format, and provided from the another device.

9. The apparatus of claim 1, wherein the network interface is compliant with a wireless protocol, and the another device is on the Internet.

10. The apparatus of claim 1, further including an audio processing circuit and an amplifier, the audio processing circuit receiving the sound signal from the input audio source and processing the sound signal in accordance with the output configuration of speakers and subsequently producing analog signals that are then amplified in the amplifier to power the speakers.

11. The apparatus of claim 1, further including a processor that executes a set of instructions to cause the first module and the second module to synthetically produce the sound effect if the number of sound channels in the output configuration is greater than the number of sound channels in the input audio source, or to synthetically reduce a sound effect if the number of sound channels in the output configuration is less than the number of sound channels in the input audio source.

12. The apparatus of claim 11, wherein a signal is generated when the number of sound channels in the output configuration is not equal to the number of sound channels in the input audio source, the signal is sent to the another device that is trigged to preprocess the sound signal so that the apparatus plays back the sound signal without processing the sound signal locally.

13. The apparatus of claim 12, wherein the signal is an UPnP message to be sent to still another device on a network so that the still another device having similar features of the apparatus preprocess the input signals.

14. The apparatus of claim 1, further including a subwoofer detection module detecting presence or absence of a subwoofer in the output configuration.

15. The apparatus of claim 14, wherein the subwoofer detection module detects the subwoofer by reading a voltage in a tip-shunt connector for the subwoofer.

16. The apparatus of claim 14, wherein the subwoofer detection module detects the subwoofer by a physical presence thereof.

17. A method for processing input signals in accordance with an output configuration, the method comprising:

comparing a number of sound channels in a sound signal of an input audio source selected from a controller to a number of sound channels in the output configuration, wherein the sound signal is represented in a sequence of data packets, each of the data packets including an IP address and received via a network interface in accordance with an Internet protocol, wherein the network interface reassembles the data packets received from the data network into the input audio source, the apparatus is coupled to at least another device over the network, the network interface is capable of assembling an audio source into smaller packets to be transmitted over the data network to the another device, the controller communicates with the apparatus via the network interface;

determining whether a sound in the input audio source is reproducible properly through speakers of the output configuration;

producing synthetically a sound effect from the audio source if the number of sound channels in the input audio source is greater than the number of sound channels in the output configuration, or reducing synthetically a sound effect from the audio source if the number of sound channels in the input audio source is less than the number of sound channels in the output configuration.

18. The method of claim 17, wherein the sound channels include a left channel effect and a right channel effect, and the output configuration includes a left speaker, a right speaker and a subwoofer, and wherein the sound effect produced synthetically includes respective portions of the left effect or the right effect in the input audio, and is reproduced through the subwoofer.

19. The method of claim 18, wherein the respective portions of the left effect or the right effect in the input audio include frequencies below a predetermined frequency.

20. The method of claim 18, wherein the left channel effect and the channel right effect originally in the input audio are respectively revised by removing the respective portions of the left channel effect and the right channel effect, and respectively reproduced in the left speaker and the right speaker.

21. The method of claim 17, wherein the sound channels include a left channel effect, a right channel effect and a subwoofer effect, and the output configuration includes a left speaker and a right speaker, and wherein the sound effect reduced synthetically is the subwoofer effect.

22. The method of claim 21, wherein the left effect and the right effect originally in the input audio are respectively revised to include at least some of the subwoofer effect.

23. The method of claim 22, wherein the revised left effect and the right effect are respectively reproduced in the left speaker and the right speaker.

24. The method of claim 17, wherein the input audio source is in digital format, and provided from another device.

25. The method of claim 17, further receiving the input audio source from the Internet or another device via a network interface.

26. The method of claim 17, further including executing a set of instructions to cause the first module and the second module to synthetically produce the sound effect if the number of sound channels in the input audio source is greater than the number of sound effects in the output configuration, and to synthetically reduce a sound effect if the number of sound channels in the input audio source is less than the number of sound effects in the output configuration.

27. The method of claim 26, wherein a signal is generated when the number of sound channels in the output configuration is not equal to the number of sound effects in the input source.

28. The method of claim 27, wherein the signal is an UPnP message.

29. The method of claim 17, further detecting presence or absence of a subwoofer in the output configuration.

30. The method of claim 29, wherein the subwoofer detection module detects the subwoofer by reading a voltage in a tip-shunt connector for the subwoofer.

31. A system for processing input signals in accordance with an output configuration, the system comprising:

a first player receiving a sound signal from an audio source represented in data packets via a network interface therein;

a second player operated to play the audio source from the first player, a module in the second player configured to perform operations of:

comparing a number of sound effects presented in the audio source to a number of sound channels in an output configuration thereof;

determining whether a sound in the input audio source can be reproduced properly through speakers of the output configuration; and sending a message to the first player when the number of sound configured in the audio source does not equal to the number of sound channels, and wherein the first player produces synthetically a sound effect if the number of sound channels is greater than the number of sound effects, or reduces synthetically a sound effect if the number of sound channels in the audio source is less than the number of sound channels in the output configuration, wherein the first player and the second player are two separate devices and coupled to each other over a data network.

32. The system of claim 31, wherein the message is an UPnP message.

33. The system of claim 31, wherein the first and second players are coupled to a data network, both the first and second players communicate in accordance with a data communication protocol.

34. The system of claim 33, wherein the sound signals is downloaded or streamed from the data network to the first player.

35. The system of claim 33, wherein the sound signal is originated in the first player.

* * * * *